United States Patent
So et al.

(10) Patent No.: US 7,751,265 B2
(45) Date of Patent: Jul. 6, 2010

(54) SEMICONDUCTOR DEVICE INCLUDING A PLURALITY OF MEMORY UNITS AND METHOD OF TESTING THE SAME

(75) Inventors: Jin Ho So, Seongnam-si (KR); Kwang Hyun Kim, Suwon-si (KR); Chan Jin Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 212 days.

(21) Appl. No.: 12/001,230

(22) Filed: Dec. 10, 2007

(65) Prior Publication Data

US 2008/0198675 A1    Aug. 21, 2008

(30) Foreign Application Priority Data

Feb. 16, 2007   (KR) ............. 10-2007-0016304

(51) Int. Cl.
*G11C 29/00* (2006.01)
(52) U.S. Cl. ............. 365/201; 365/189.05; 365/230.08; 365/189.02; 365/230.02
(58) Field of Classification Search .............. 365/201, 365/189.05, 230.08, 189.02, 230.02
See application file for complete search history.

(56) References Cited

U.S. PATENT DOCUMENTS 6,321,352 B1   11/2001   Wasson

2003/0202409 A1 *   10/2003   Yamaoka et al. ............ 365/201
2006/0034111 A1 *   2/2006   Pawlowski ................. 365/100

FOREIGN PATENT DOCUMENTS

| KR | 1998-069821 | 10/1998 |
|----|-------------|---------|
| KR | 10-2006-0029725 | 4/2006 |
| KR | 10-2007-0016485 | 2/2007 |

* cited by examiner

*Primary Examiner*—Hoai V Ho
*Assistant Examiner*—Jason Lappas
(74) *Attorney, Agent, or Firm*—Mills & Onello, LLP (57) ABSTRACT

In a semiconductor device including a plurality of memory units and a method of testing the same, the semiconductor device includes a plurality of memory units each comprising a plurality of input lines; and an input unit configured to provide a plurality of test signals to the input lines, respectively, included in each of the memory units in response to a test enable signal. A data input/output unit can be configured to receive Z-bit data from test equipment and to distribute the Z-bit data to the plurality of memory units in response to the test enable signal, where Z is a natural number. The data input/output unit outputs K-bit data, which are output from each of the plurality of memory units, through data input/output lines included in the plurality of memory units in response to the test enable signal, where $K \leq Z$ and K is a natural number.

10 Claims, 7 Drawing Sheets

SEMICONDUCTOR DEVICE INCLUDING A PLURALITY OF MEMORY UNITS AND METHOD OF TESTING THE SAME

CROSS-REFERENCE TO RELATED PATENT APPLICATIONS

This application claims the benefit of Korean Patent Application No. 10-2007-0016304, filed on Feb. 16, 2007, in the Korean Intellectual Property Office, the disclosure of which is incorporated herein in its entirety by reference.

FIELD OF THE INVENTION

The present invention relates to a semiconductor device, and more particularly, to a method and apparatus for reducing a resource, for example, the number of test pins, of test equipment, which is required to test a semiconductor device including a plurality of memory units each having independent input/output lines.

BACKGROUND OF THE INVENTION

With the demand for memory devices having an ever-larger capacity and semiconductor devices having an ever-increasing data rate to be used in various electronic devices, semiconductor devices including a plurality of memory units, each memory unit having an independent input/output line, have been developed. In order to test each of the plurality of memory units in such a semiconductor device, test equipment is configured to provide test signals or data to input lines or data input/output lines of each memory unit. Accordingly, when testing the semiconductor device including the plurality of memory units, the test equipment uses as many pins as the result of multiplying the number of input lines included in each memory unit by the number of memory units. As a result, the test equipment requires a great amount of resources, i.e., pins, for the test, which may decrease the test efficiency. Thus, the resulting productivity of semiconductor devices including a plurality of memory units can also decrease.

Therefore, it is desired to reduce resources required by test equipment when operating in a test mode.

SUMMARY OF THE INVENTION

Some embodiments of the present invention provide a method and apparatus for reducing the resources consumed by test equipment, which are required to test a semiconductor device including a plurality of memory units each having independent input lines or input/output data lines.

In one aspect, a semiconductor device comprises: a plurality of memory units each comprising a plurality of input lines; and an input unit configured to provide a plurality of test signals to the input lines, respectively, included in each of the memory units in response to a test enable signal.

In one embodiment, the input unit receives the test signals from test equipment and provides the test signals to the input lines, respectively, included in each of the memory units in response to the test enable signal.

In another embodiment, the input unit comprises: a buffer unit configured to store the test signals received from test equipment and to provide the test signals to the input lines, respectively, included in one memory unit among the plurality of memory units; and a switching unit configured to switch the test signals provided from the buffer unit to the input lines, respectively, included in each of remaining memory units among the plurality of memory units in response to the test enable signal.

In another embodiment, the switching units comprises: a plurality of switches configured to connect corresponding input lines included in the plurality of memory units in response to the test enable signal; a plurality of termination resistors each having a first end connected with a first power supply; and a plurality of termination resistance switches configured to respectively connect the input lines included in a last memory unit among the plurality of memory units with second ends, respectively, of the respective termination resistors in response to the test enable signal.

In another embodiment, the input unit comprises: a plurality of buffer units, one of the buffer units configured to receive and store the plurality of test signals from test equipment; and a switching unit configured to switch the test signals received from the test equipment to remaining buffer units of the plurality of buffer units in response to the test enable signal, and wherein each of the plurality of buffer units provides the test signals to the input lines, respectively, included in a corresponding memory unit among the plurality of memory units.

In another embodiment, the switching unit comprises: a plurality of switches configured to switch the test signals received by the one buffer unit to input terminals, respectively, included in each of the remaining buffer units in response to the test enable signal; a plurality of termination resistors each having a first end connected with a first power supply; and a plurality of termination resistance switches configured to respectively connect the input terminals included in a last buffer unit among the plurality of buffer units with second ends, respectively, of the respective termination resistors in response to the test enable signal.

In another aspect, a semiconductor device comprises: a plurality of memory units each comprising a plurality of data input/output lines; and a data input/output unit configured to receive Z-bit data from test equipment and to distribute the Z-bit data to the plurality of memory units in response to a test enable signal, where Z is a natural number.

In one embodiment, the data input/output unit receives the Z-bit data through the data input/output lines included in one memory unit among the plurality of memory units.

In another embodiment, the data input/output unit outputs K-bit data, which are output from each of the plurality of memory units, through the data input/output lines included in the plurality of memory units in response to the test enable signal, where K≦Z and K is a natural number.

In another embodiment, the data input/output unit outputs K-bit data, which are output from each of the plurality of memory units, through the data input/output lines included in one memory unit among the plurality of memory units in response to the test enable signal.

In another aspect, a method of testing a semiconductor device including a plurality of memory units comprises: receiving a test enable signal; and providing a plurality of test signals to a plurality of input lines, respectively, included in each of the memory units in response to the test enable signal.

In one embodiment, providing the test signals to the input lines comprises receiving the test signals from test equipment and providing the test signals to the input lines, respectively, included in each of the memory units in response to the test enable signal.

In another embodiment, providing the test signals to the input lines comprises: storing the test signals received from test equipment and providing the test signals to the input lines, respectively, included in one memory unit among the plurality of memory units; and switching the stored test signals to the input lines, respectively, included in each of remaining memory units among the plurality of memory units in response to the test enable signal.

In another embodiment, providing the test signals to the input lines comprises: receiving and storing the plurality of test signals from test equipment using one buffer unit among a plurality of buffer units; switching the test signals received by the one buffer unit from the test equipment to remaining buffer units of the plurality of buffer units in response to the test enable signal; and providing the test signals stored in each of the plurality of buffer units to the input lines, respectively, included in a corresponding memory unit among the plurality of memory units.

In another aspect, a method of testing a semiconductor device including a plurality of memory units comprises: receiving a test enable signal; and receiving Z-bit data from test equipment and distributing the Z-bit data to the plurality of memory units in response to the test enable signal, where Z is a natural number.

In one embodiment, receiving and distributing the Z-bit data comprises receiving the Z-bit data through data input/output lines included in one memory unit among the plurality of memory units.

In another embodiment, the method further comprises outputting K-bit data, which are output from each of the plurality of memory units, through data input/output lines included in the plurality of memory units in response to the test enable signal, where K≦Z and K is a natural number.

In another embodiment, outputting the K-bit data through the data input/output lines comprises outputting the K-bit data, which are output from each of the plurality of memory units, through the data input/output lines included in one memory unit among the plurality of memory units in response to the test enable signal.

BRIEF DESCRIPTION OF THE DRAWINGS

The above and other features and advantages of the embodiments of the present invention will become more apparent by describing in detail exemplary embodiments thereof with reference to the attached drawings in which.

DETAILED DESCRIPTION OF EMBODIMENTS

Embodiments of the present invention will now be described more fully hereinafter with reference to the accompanying drawings, in which embodiments of the invention are shown. The invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected", "coupled", or "adjacent" to another element, it can be directly connected or coupled to the other element or intervening elements may be present. In contrast, when an element is referred to as being "directly connected", "directly coupled", or "directly adjacent" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
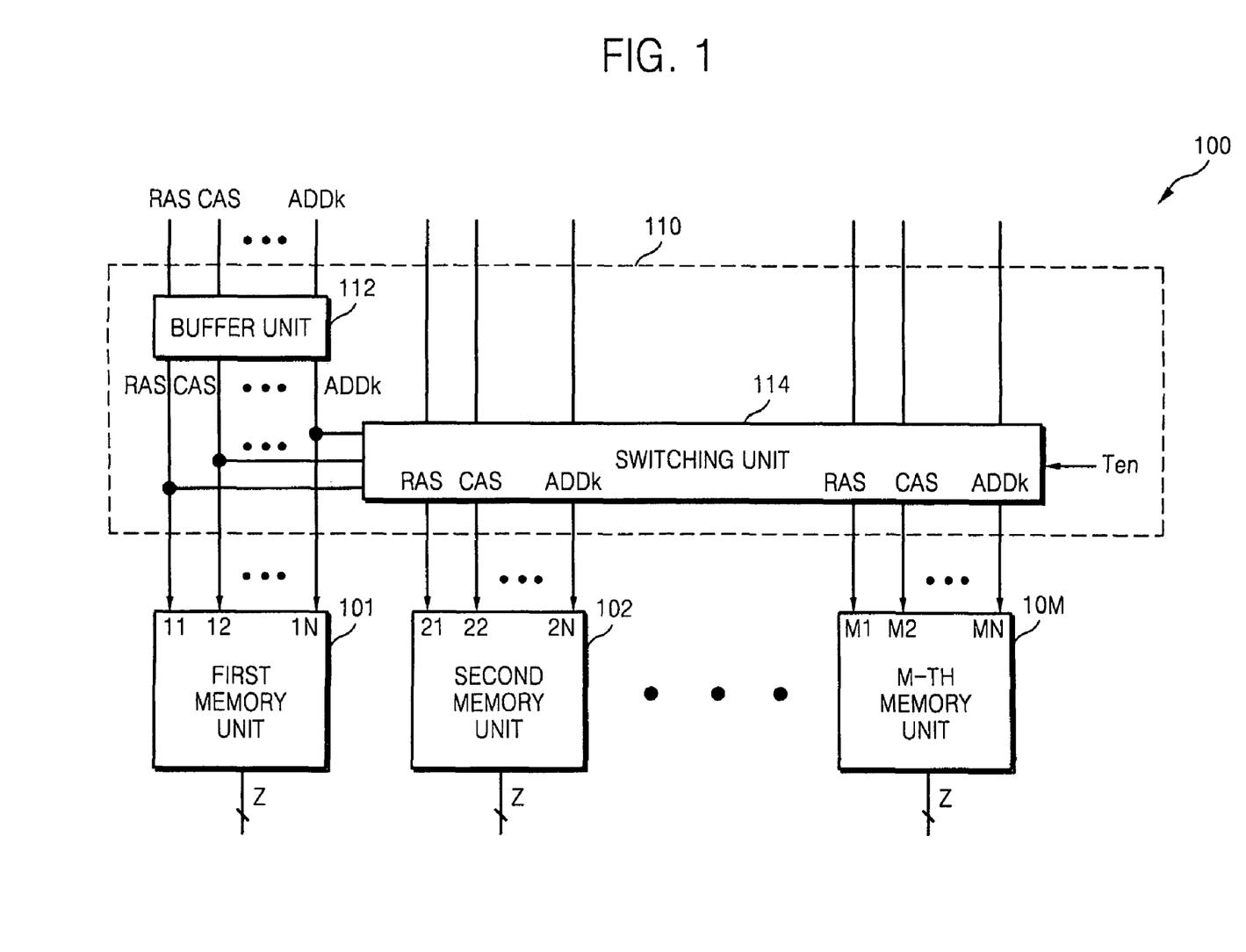
FIG. 1 is a block diagram of a semiconductor device according to some embodiments of the present invention.

FIG. 1 is a block diagram of a semiconductor device 100 according to some embodiments of the present invention. Referring to FIG. 1, the semiconductor device 100 includes a plurality of memory units 101 through 10M (where M is a natural number) and an input unit 110. The semiconductor device 100 may enter a test mode in response to a test enable signal Ten.

Each of the memory units 101 through 10M includes a plurality of input lines. For instance, the first memory unit 101 may include a plurality of input lines 11 through 1N (where N is a natural number).

The input unit 110 provides a plurality of test signals to the input lines, respectively, included in each of the memory units 101 through 10M in response to the test enable signal Ten. For instance, the test signals can include a row address strobe signal RAS, a column address strobe signal CAS, a chip enable signal CS, a clock signal CLK, and address signals ADD0 through ADDk. The input unit 110 can include a buffer unit 112 and a switching unit 114.

The buffer unit 112 can receive the plurality of test signals from test equipment (not shown) and store the received test signals. The buffer unit 112 provides the test signals to the input lines, respectively, of one of the memory units, for example, the memory unit 101, of the memory units 101 through 10M.

The switching unit 114 provides the test signals received from the buffer unit 112 to the input lines, respectively, of each of the remaining memory units, for example, the memory units 102 through 10M, of the memory units 101 through 10M.

Accordingly, when N (where N is a natural number) test signals are needed to test a single memory unit, the test equipment can separately provide the plurality of test signals to the memory units 101 through 10M using only N resources (e.g., N pins) for providing the N test signals to the buffer unit 112. In other words, according to the present embodiments of the present invention, all of the memory units 101 through 10M each including a plurality of independent input lines in the semiconductor device 100 can be tested using the resources (or test pins) of the test equipment, which are required to test a single memory unit, e.g., the memory unit 101.

Figure 2:
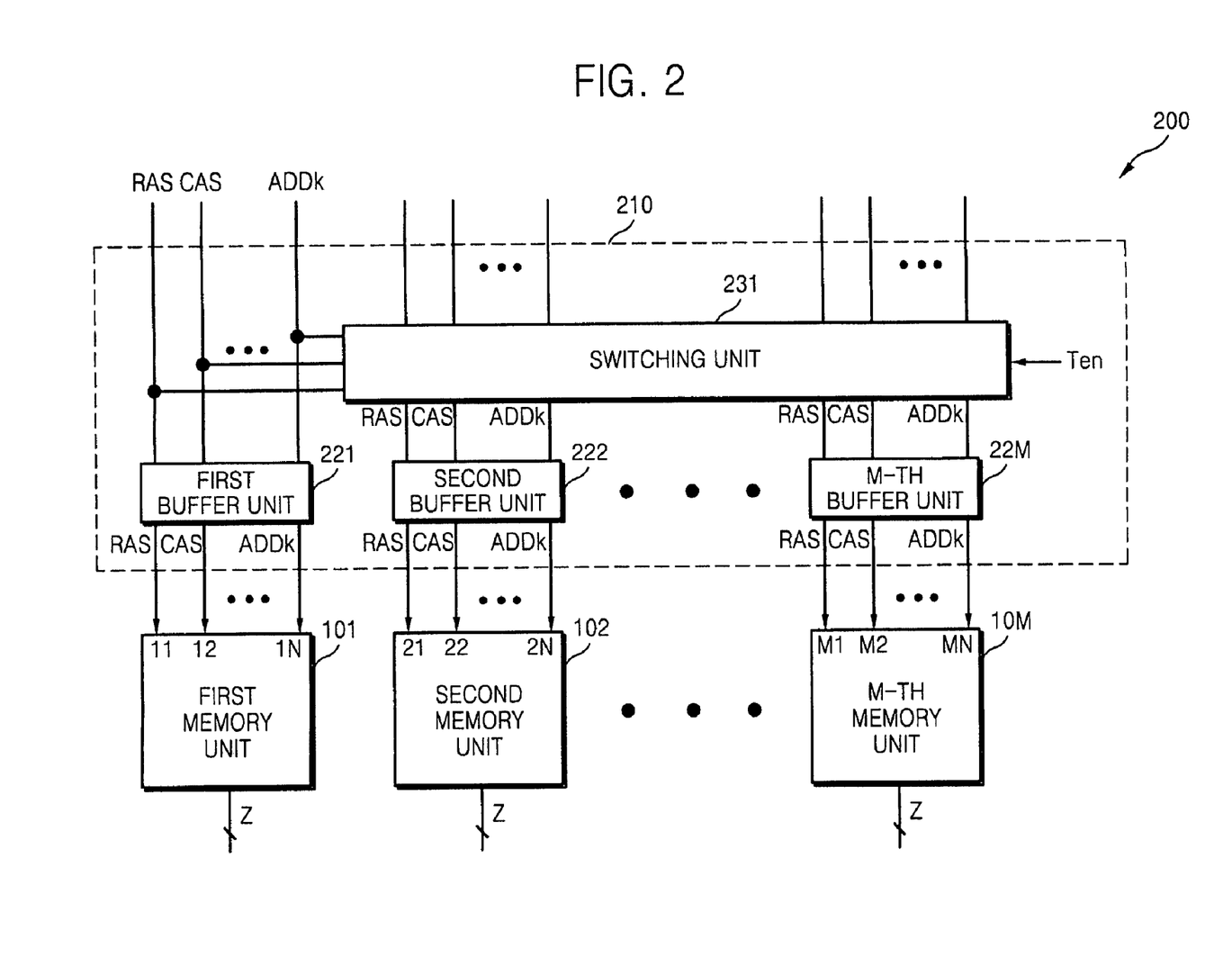
FIG. 2 is a block diagram of a semiconductor device according to other embodiments of the present invention.

FIG. 2 is a block diagram of a semiconductor device 200 according to other embodiments of the present invention. Referring to FIG. 2, the semiconductor device 200 includes an input unit 210 and a plurality of the memory units 101 through 10M. The semiconductor device 200 may enter a test mode in response to the test enable signal Ten.

The input unit 210 includes a plurality of buffers 221 through 22M (M is a natural number) and a switching unit 231. Among the buffer units 221 through 22M, one buffer unit, e.g., the buffer unit 221, receives a plurality of test signals (e.g., RAS, CAS, and ADDk) from test equipment (not shown) and stores the received test signals. The buffer unit 221 provides the test signals to input lines, respectively, of one of the memory units, e.g., the memory unit 101, among the plurality of the memory units 101 through 10M.

The switching unit 231 switches the test signals to the remaining buffer units, e.g., 222 through 22M, among the plurality of the buffer units 221 through 22M in response to the test enable signal Ten. Accordingly, each of the remaining buffer units 222 through 22M may receive the test signals (e.g., RAS, CAS, and ADDk) from the test equipment via the switching unit 231 and store the test signals.

As a result, the buffer units 221 through 22M can provide the test signals to the memory units 101 through 10M, respectively. For instance, the test signals stored in the buffer unit 222 can be input to input lines 21 through 2N, respectively, included in the memory unit 102.

As a result, according to the present embodiments of the present invention, all of the memory units 101 through 10M each including a plurality of independent input lines in the semiconductor device 200 can be tested using the resources (or test pins) of the test equipment, which are required to test a single memory unit, e.g., the memory unit 101.

Figure 3:
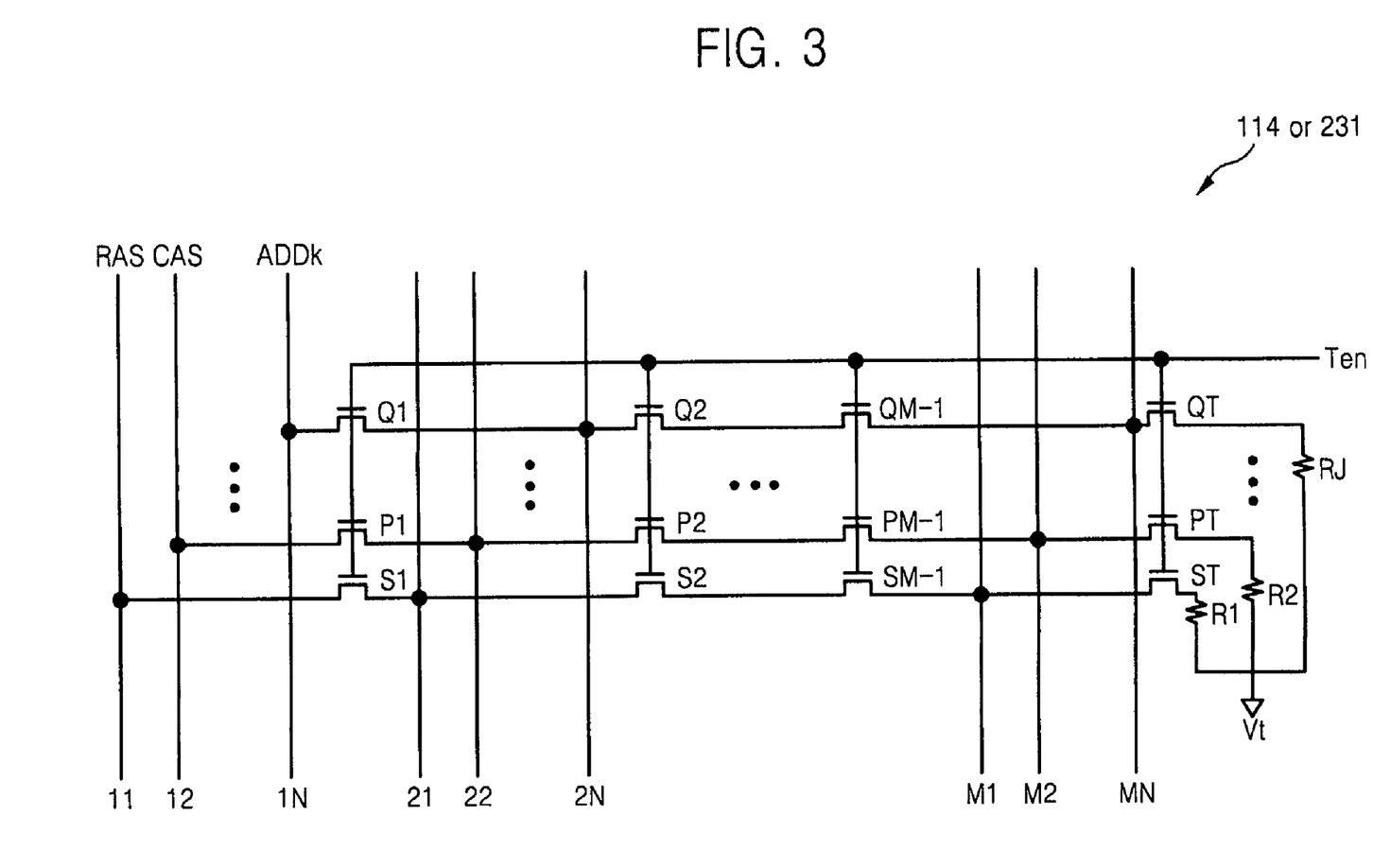
FIG. 3 is a detailed circuit diagram of a switching unit illustrated in FIG. 1 or 2.

FIG. 3 is a detailed circuit diagram of the switching unit 114 or 231 illustrated in FIG. 1 or 2. The switching unit 114 illustrated in FIG. 1 may be similar to or the same as the switching unit 231 illustrated in FIG. 2, with the exception being that they can have different input and output connections. Referring to FIG. 3, the switching unit 114 or 231 includes a plurality of switches S1 through SM-1, P1 through PM-1, and Q1 through QM-1; a plurality of termination resistance switches ST, PT, and QT; and a plurality of termination resistors R1 through RJ.

The switches S1 through SM-1, P1 through PM-1, and Q1 through QM-1 are turned on or off in response to the test enable signal Ten and can mutually connect the corresponding input lines of the plurality of input lines included in the memory units 101 through 10M when the corresponding device is operating in a test mode. For instance, each of the switches S1 through SM-1 may connect adjacent first input lines among first input lines 11 through M1 respectively included in the memory units 101 through 10M in the test mode. For example, the first switch S1 may connect the first input line 11 included in the first memory unit 101 with the first input line 21 included in the second memory unit 102.

First ends of the respective termination resistors R1 through RJ are connected with a first power supply Vt. The termination resistance switches ST through QT may respectively connect the input lines included in the last memory unit 10M among the plurality of the memory units 101 through 10M with second ends of the respective termination resistors R1 through RJ in response to the test enable signal Ten.

The switches S1 through SM-1, P1 through PM-1, and Q1 through QM-1 and the termination resistance switches ST through QT may be turned on or off in response to the test enable signal Ten.

Figure 4:
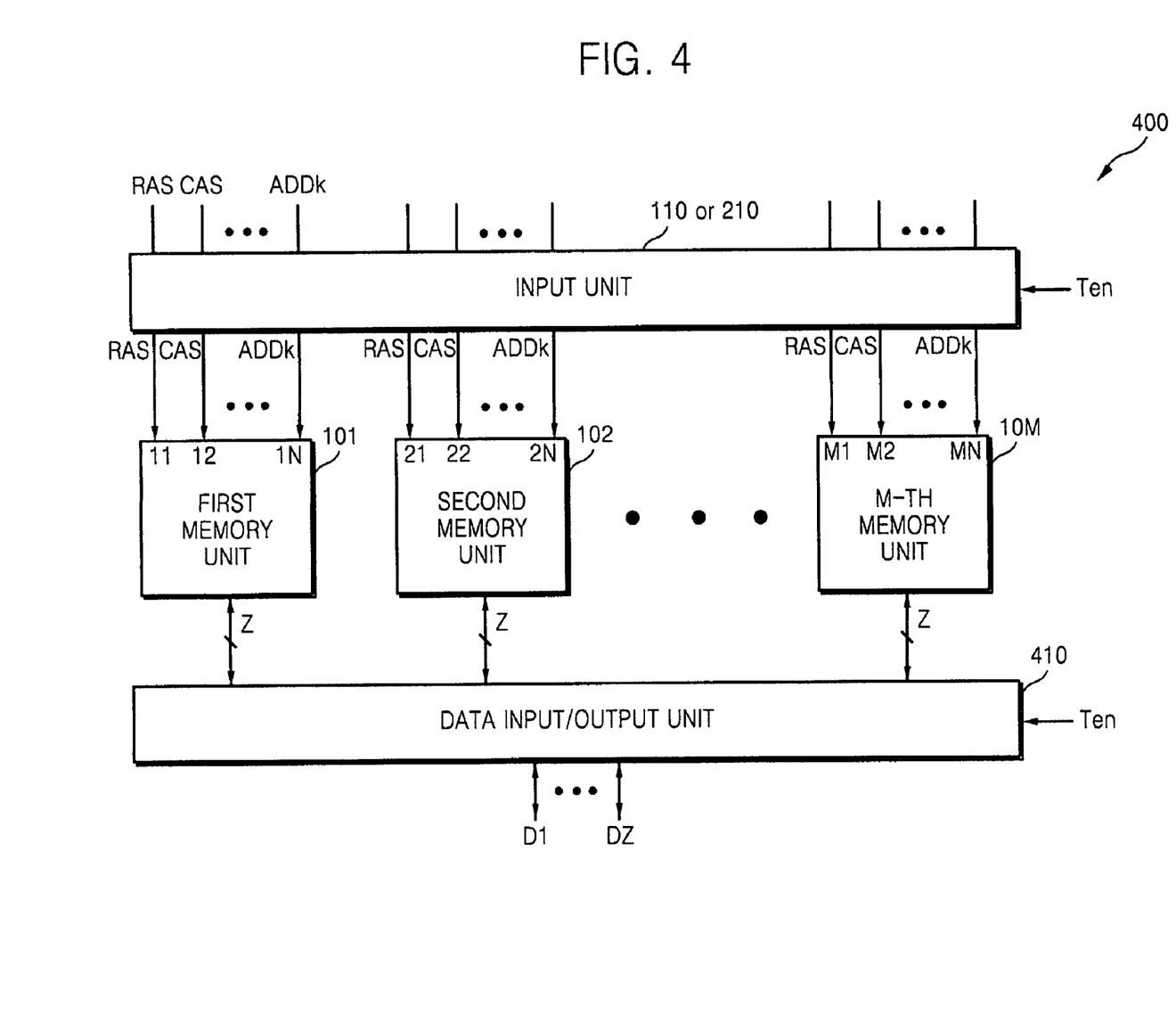
FIG. 4 is a block diagram of a semiconductor device according to yet other embodiments of the present invention.

FIG. 4 is a block diagram of a semiconductor device 400 according to yet other embodiments of the present invention. Referring to FIG. 4, the semiconductor device 400 includes the input unit 110 or 210, a plurality of the memory units 101 through 10M, and a data input/output unit 410. The semiconductor device 400 can enter the test mode in response to the test enable signal Ten.

Each of the memory units 101 through 10M can include a plurality of data input/output lines. In detail, each of the memory units 101 through 10M may include Z (where Z is a natural number) data input/output lines.

The data input/output unit 410 can receive data of Z bits D1 through DZ of data from test equipment (not shown) in response to the test enable signal Ten and distribute the data of Z bits D1 through DZ to the memory units 101 through 10M. For instance, the data input/output unit 410 may receive the data of Z bits D1 through DZ from the test equipment via the Z data input/output lines included in one of the memory units 101 through 10M in response to the test enable signal Ten.

In detail, it is assumed that the semiconductor device 400 includes M (in this example, M=4) memory units 101 through 104 and each of the memory units 101 through 104 includes Z (in this example, Z=32) data input/output lines. The data input/output unit 410 can receive data of 32 bits D1 through DZ (Z=32) via 32 data input/output lines D11 through D1K (K=32) included in the first memory unit 101. The data input/output unit 410 can optionally distribute a portion, for example 8 bits, of the data of 32 bits D1 through DZ to each of the memory units 101 through 104.

In the test mode, each of the memory units 101 through 10M may input/output data of K bits using K input/output data lines (where K≦Z and K is a natural number) among the Z data input/output lines. In the test mode, the data input/output unit 410 may output data of K bits provided from each of the memory units 101 through 10M via the data input/output lines included in the memory units 101 through 10M. For instance, the data input/output unit 410 may output data of K bits output from each of the memory units 101 through 10M via data input/output lines included in one of the memory units 101 through 10M.

In detail, it is assumed that the semiconductor device 400 includes M (e.g., M=4) memory units 101 through 104 and each of the memory units 101 through 104 includes Z (e.g., Z=32) data input/output lines. In the test mode, each of the memory units 101 through 104 may output data of K bits (e.g., K=8) via K data input/output lines among the 32 data input/output lines. Accordingly, the memory units 101 through 104 may output a total of 32 bits of data in the test mode. In another example, the data input/output unit 410 may output the 32 bits of data output from the memory units 101 through 10M via the 32 data input/output lines included in the first memory unit 101.

Figure 5:
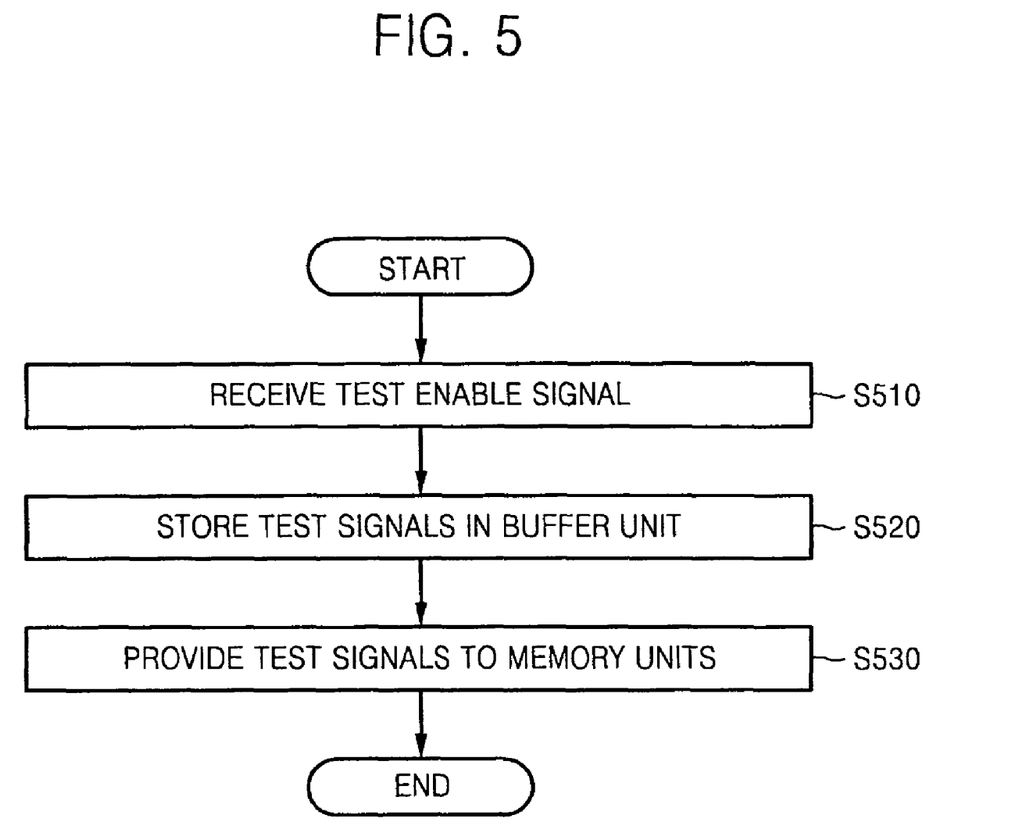
FIG. 5 is a flowchart of a method of testing a semiconductor device including a plurality of memory units, according to some embodiments of the present invention.

FIG. 5 is a flowchart of a method of testing the semiconductor device 100 including a plurality of memory units illustrated in FIG. 1, according to some embodiments of the present invention. Referring to FIGS. 1 and 5, in operation S510, the semiconductor device 100 receives the test enable signal Ten. The semiconductor device 100 enters the test mode in response to the test enable signal Ten.

In the test mode, the input unit 110 provides a plurality of test signals received from test equipment to a plurality of input lines, respectively, included in each of the plurality of the memory units 101 through 10M. For instance, the input unit 110 can store the test signals received from the test equipment in operation S520 and provide the test signals to the input lines, respectively, included in one of the memory units 101 through 10M in operation S530. In addition, the input unit 110 can receive the test signals received from the test equipment, store the received test signals in the buffer unit 112 and provide the test signals stored in the buffer unit 112 to the input lines, respectively, included in each of the remaining ones among the memory units 101 through 10M in operation S530.

Figure 6:
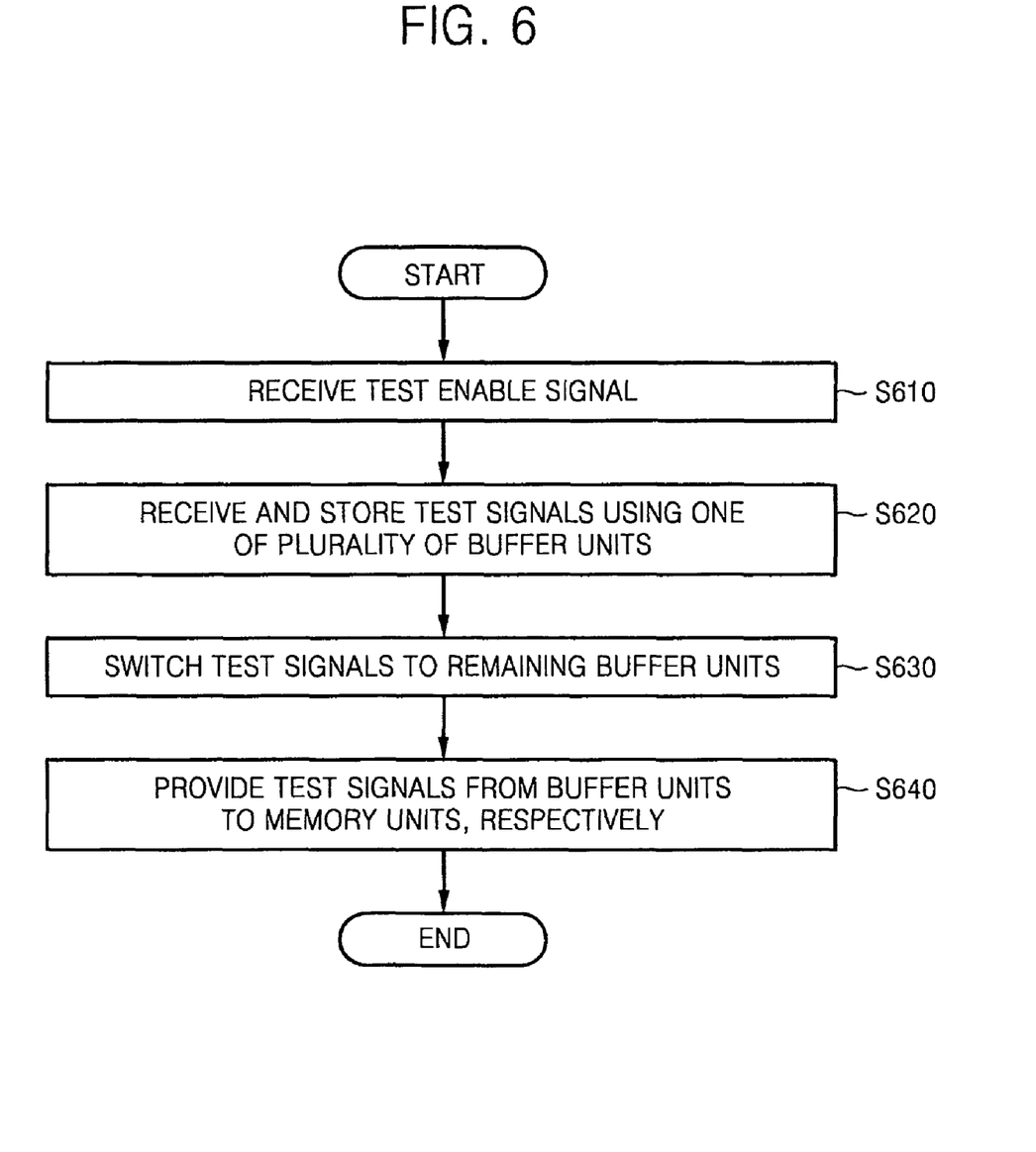
FIG. 6 is a flowchart of a method of testing a semiconductor device including a plurality of memory units, according to other embodiments of the present invention.

FIG. 6 is a flowchart of a method of testing the semiconductor device 200 including a plurality of memory units illustrated in FIG. 2, according to other embodiments of the present invention. Referring to FIGS. 2 and 6, in operation S610, the semiconductor device 200 receives the test enable signal Ten. The semiconductor device 200 can enter the test mode in response to the test enable signal Ten.

In operation S620, the input unit 210 can receive and store a plurality of test signals from test equipment using one of the buffer units 221 through 22M. In operation S630, the input unit 210 can switch the test signals received by the one buffer unit from the test equipment to the remaining buffer units among the buffer units 221 through 22M in response to the test enable signal Ten.

In operation S640, the input unit 210 provides the test signals stored in each of the buffer units 221 through 22M to the input lines, respectively, included in a corresponding one of the memory units 101 through 10M.

Figure 7:
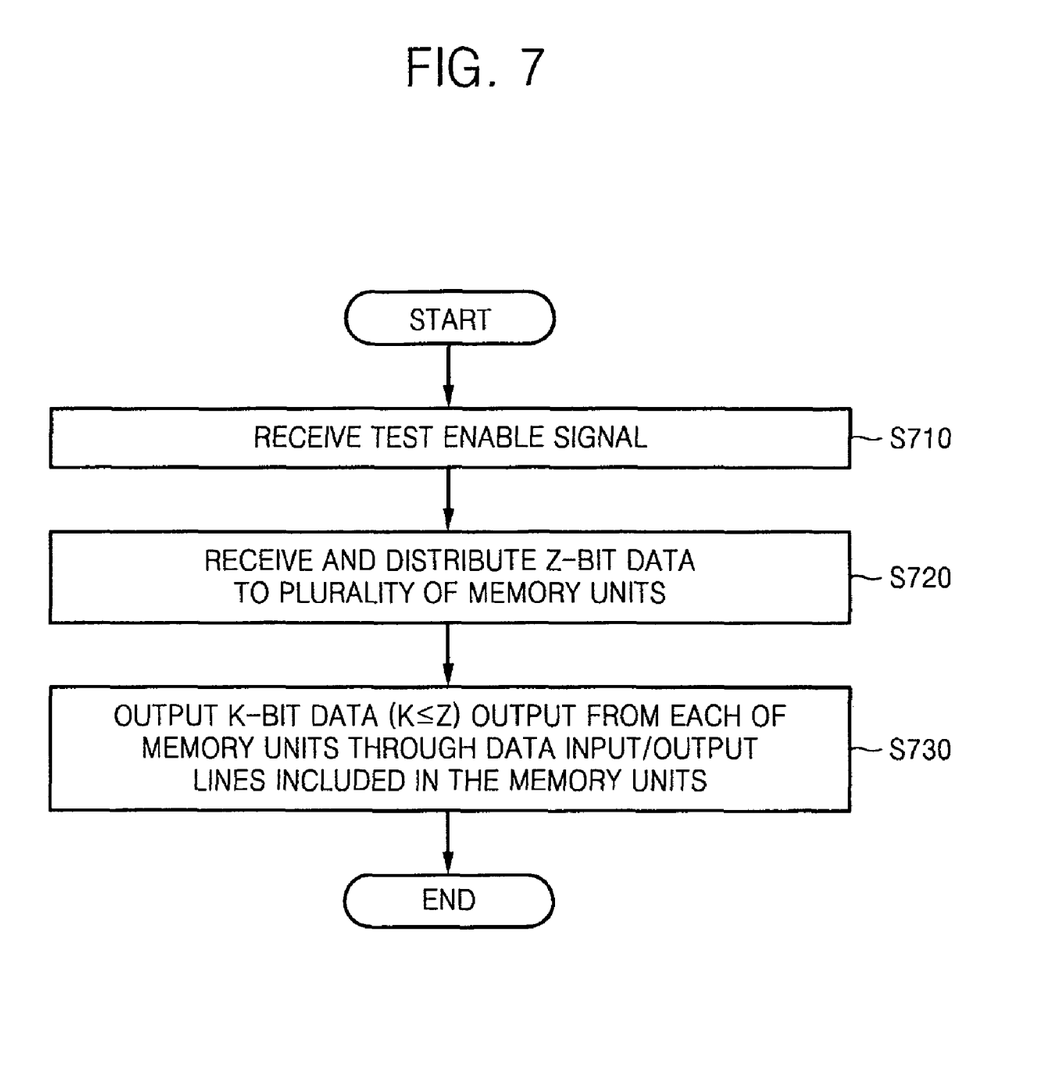
FIG. 7 is a flowchart of a method of testing a semiconductor device including a plurality of memory units, according to yet other embodiments of the present invention.

FIG. 7 is a flowchart of a method of testing the semiconductor device 400 including a plurality of memory units illustrated in FIG. 4, according to yet other embodiments of the present invention. Referring to FIGS. 4 and 7, in operation S710, the data input/output unit 410 receives the test enable signal Ten.

In operation S720, the data input/output unit 410 can receive data of Z bits D1 through DZ (where Z is a natural number) from the test equipment in the test mode and distribute the Z-bit data D1 through DZ to the memory units 101 through 10M. For instance, in the test mode, the Z-bit data D1 through DZ can be received from the test equipment through data input/output lines included in one of the memory units 101 through 10M.

In operation S730, the data input/output unit 410 outputs K-bit data (where $K \leq Z$ and K is a natural number) received from each of the memory units 101 through 10M through the data input/output lines included in the memory units 101 through 10M in the test mode. For instance, the data input/output unit 410 can output the K-bit data, which is provided from each of the memory units 101 through 10M, through the data input/output lines included in at least one of the memory units 101 through 10M during operation in the test mode.

As described above, according to some embodiments of the present invention, resources of test equipment required to test a semiconductor device including a plurality of memory units can be reduced.

While embodiments of the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. A semiconductor device comprising:
   a plurality of memory units each comprising a plurality of input lines; and
   an input unit configured to provide a plurality of test signals to the input lines, respectively, included in each of the memory units in response to a test enable signal, wherein:
   in a test mode the input unit receives test signals from test equipment and provides the test signals to the input lines of each of the memory units in common, and
   in a non-test mode the input unit lines of each of the memory units are maintained independent from the input lines of the other memory units.

2. The semiconductor device of claim 1, wherein the input unit comprises:
   a plurality of switches configured to be turned on or off in response to the test enable signal, to connect the corresponding input lines of the plurality of input lines included in the memory units in the test mode and to disconnect the corresponding input lines of the plurality of input lines included in the memory units in the non-test mode.

3. The semiconductor device of claim 1, wherein the input unit comprises:
   a buffer unit configured to store the test signals received from the test equipment and to provide the test signals to the input lines, respectively, included in one memory unit among the plurality of memory units; and
   a switching unit configured to switch the test signals provided from the buffer unit to the input lines, respectively, included in each of remaining memory units among the plurality of memory units in response to the test enable signal.

4. The semiconductor device of claim 3, wherein the switching units comprises:
   a plurality of switches configured to connect corresponding input lines included in the plurality of memory units in response to the test enable signal;
   a plurality of termination resistors each having a first end connected with a first power supply; and
   a plurality of termination resistance switches configured to respectively connect the input lines included in a last memory unit among the plurality of memory units with second ends, respectively, of the respective termination resistors in response to the test enable signal.

5. The semiconductor device of claim 1, wherein the input unit comprises:
   a plurality of buffer units, one of the buffer units configured to receive and store the plurality of test signals from test equipment; and
   a switching unit configured to switch the test signals received from the test equipment to remaining buffer units of the plurality of buffer units in response to the test enable signal, and wherein each of the plurality of buffer units provides the test signals to the input lines, respectively, included in a corresponding memory unit among the plurality of memory units.

6. The semiconductor device of claim 5, wherein the switching unit comprises:
   a plurality of switches configured to switch the test signals received by the one buffer unit to input terminals, respectively, included in each of the remaining buffer units in response to the test enable signal;
   a plurality of termination resistors each having a first end connected with a first power supply; and
   a plurality of termination resistance switches configured to respectively connect the input terminals included in a last buffer unit among the plurality of buffer units with second ends, respectively, of the respective termination resistors in response to the test enable signal.

7. A method of testing a semiconductor device including a plurality of memory units, the method comprising:
   receiving a test enable signal; and
   in a test mode, receiving test signals from test equipment and providing the test signals to the input lines of each of the memory units in common, and
   in a non-test mode, maintaining the input unit lines of each of the memory units independent from the input lines of the other memory units.

8. The method of claim 7, further comprising:
   connecting the corresponding input lines of the plurality of input lines included in the memory units in the test mode by turning on a plurality of switches; and
   disconnecting the corresponding input lines of the plurality of input lines included in the memory units in the non-test mode by turning off the plurality of switches.

9. The method of claim 7, wherein the providing the test signals to the input lines comprises:
   storing the test signals received from test equipment and providing the test signals to the input lines, respectively, included in one memory unit among the plurality of memory units; and
   switching the stored test signals to the input lines, respectively, included in each of remaining memory units among the plurality of memory units in response to the test enable signal.

10. The method of claim 7, wherein the providing the test signals to the input lines comprises:
   receiving and storing the plurality of test signals from test equipment using one buffer unit among a plurality of buffer units;
   switching the test signals received by the one buffer unit from the test equipment to remaining buffer units of the plurality of buffer units in response to the test enable signal; and
   providing the test signals stored in each of the plurality of buffer units to the input lines, respectively, included in a corresponding memory unit among the plurality of memory units.

* * * * *